United States Patent
Lee et al.

(10) Patent No.: US 10,316,216 B2
(45) Date of Patent: Jun. 11, 2019

(54) COMPOSITION FOR FORMING SILICA LAYER, AND SILICA LAYER

(71) Applicant: SAMSUNG SDI CO., LTD., Yongin-si, Gyeonggi-do (KR)

(72) Inventors: Jiho Lee, Suwon-si (KR); Sooyeon Sim, Suwon-si (KR); Jingyo Kim, Suwon-si (KR); Youngjae Joo, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/478,278

(22) Filed: Apr. 4, 2017

(65) Prior Publication Data

US 2018/0057709 A1    Mar. 1, 2018

(30) Foreign Application Priority Data

Aug. 31, 2016  (KR) .................... 10-2016-0112026
Sep. 22, 2016  (KR) .................... 10-2016-0121750

(51) Int. Cl.
| | | |
|---|---|---|
| C09D 183/16 | (2006.01) | |
| C01B 33/12 | (2006.01) | |
| H01L 23/29 | (2006.01) | |
| B05D 1/00 | (2006.01) | |
| H01L 23/31 | (2006.01) | |

(52) U.S. Cl.
CPC .............. *C09D 183/16* (2013.01); *B05D 1/00* (2013.01); *C01B 33/12* (2013.01); *H01L 23/296* (2013.01); *H01L 23/3171* (2013.01)

(58) Field of Classification Search
None
See application file for complete search history.

(56) References Cited

U.S. PATENT DOCUMENTS

| | | |
|---|---|---|
| 4,656,300 A | 4/1987 | Lebrun et al. |
| 4,840,778 A | 6/1989 | Arai et al. |
| 5,084,423 A | 1/1992 | Vaahs et al. |
| 6,767,641 B1 | 7/2004 | Shimizu et al. |
| 2007/0259106 A1* | 11/2007 | Shimizu ............... C08G 77/62 427/126.1 |
| 2010/0234540 A1* | 9/2010 | Ozaki ..................... C08K 5/17 525/474 |
| 2011/0188213 A1* | 8/2011 | Domae .................. C08L 83/04 361/748 |
| 2012/0164382 A1* | 6/2012 | Yun ................... H01L 21/02164 428/141 |
| 2015/0093545 A1* | 4/2015 | Han ..................... C09D 183/16 428/156 |

(Continued)

FOREIGN PATENT DOCUMENTS

| | | |
|---|---|---|
| JP | 05-311120 A | 11/1993 |
| JP | 06-136131 A | 5/1994 |

(Continued)

*Primary Examiner* — Robert S Loewe
(74) *Attorney, Agent, or Firm* — Lee & Morse, P.C.

(57) ABSTRACT

A composition for forming a silica layer, a silica layer, and an electronic device, the composition including a silicon-containing polymer; and a solvent, wherein a $^1$H-NMR spectrum of the silicon-containing polymer satisfies Equations 1 and 2:

$B/A=0.2$ to $0.4$    [Equation 1]

$(A+B)/C=4.8$ to $12.0$.    [Equation 2]

11 Claims, 2 Drawing Sheets

(56) References Cited

U.S. PATENT DOCUMENTS

2016/0099145 A1\* 4/2016 Yun .................. H01L 21/02222
                                                          438/790

FOREIGN PATENT DOCUMENTS

| JP | 07-223867 A | 8/1995 |
|----|----|----|
| JP | 2613787 B2 | 5/1997 |
| JP | 2651464 B2 | 9/1997 |
| JP | 10-140087 A | 5/1998 |
| JP | 2750405 B2 | 5/1998 |
| JP | 4159937 B2 | 10/2008 |
| JP | 5692736 B2 | 4/2015 |
| KR | 10-0298100 B1 | 5/2001 |
| KR | 10-1056838 B1 | 8/2011 |
| KR | 10-2012-0066389 A | 6/2012 |
| KR | 10-2012-0071311 A | 7/2012 |
| KR | 10-2014-0024342 A | 2/2014 |
| KR | 10-1583232 B1 | 12/2015 |
| KR | 10-1599952 B1 | 2/2016 |

\* cited by examiner

COMPOSITION FOR FORMING SILICA LAYER, AND SILICA LAYER

CROSS-REFERENCE TO RELATED APPLICATION

Korean Patent Applications No. 10-2016-0112026, filed on Aug. 31, 2016, and No. 10-2016-0121750, filed on Sep. 22, 2016 in the Korean Intellectual Property Office, and entitled: "Composition for Forming Silica Layer, and Silica Layer," is incorporated by reference herein in its entirety.

BACKGROUND

1. Field

Embodiments relate to a composition for forming a silica layer and a silica layer manufactured using the composition.

2. Description of the Related Art

A flat panel display may use a thin film transistor (TFT) including a gate electrode, a source electrode, a drain electrode, and a semiconductor as a switching device and is equipped with a gate line transferring a scan signal for controlling the thin film transistor and a data line transferring a signal applied to a pixel electrode. In addition, an insulation layer may be formed between the semiconductor and the several electrodes to separate them.

SUMMARY

Embodiments are directed to a composition for forming a silica layer and a silica layer manufactured using the composition.

The embodiments may be realized by providing a composition for forming a silica layer, the composition including a silicon-containing polymer; and a solvent, wherein a $^1$H-NMR spectrum of the silicon-containing polymer satisfies Equations 1 and 2:

$$B/A = 0.2 \text{ to } 0.4 \quad \text{[Equation 1]}$$

$$(A+B)/C = 4.8 \text{ to } 12.0 \quad \text{[Equation 2]}$$

wherein, in Equations 1 and 2, A is a peak area of greater than or equal to about 4.5 ppm and less than about 5.5 ppm, B is a peak area of greater than or equal to about 3.8 ppm and less than about 4.5 ppm, and C is a peak area of greater than or equal to about 0.2 ppm and less than 2.5 ppm:

the $^1$H-NMR spectrum being measured according to Condition 1:

[Condition 1]

adding the silicon-containing polymer to a dibutylether (DBE) solvent to prepare a Sample 1 having a solid content of about 15±0.1 wt %, taking 3 cc of the Sample 1, dispensing the Sample 1 in the center of a silicon wafer having a diameter of 8 inch using a spin coater, and spin-rotating it at 1,500 rpm for 5 minutes to form a film on the silicon wafer, taking the film with a cutter and mixing the taken film with a CDCl$_3$ (chloroform-d) solvent to prepare a solution, preparing a Sample 2 where a content of the taken film is 3.0 wt % based on a total amount of the solution, and measuring a $^1$H-NMR spectrum of the Sample 2 at 300 MHz.

In Equation 2, (A+B)/C may range from about 5.0 to about 10.5.

In Equation 2, (A+B)/C may range from about 5.2 to about 9.0.

The silicon-containing polymer may include a polysilazane, a polysiloxazane, or a combination thereof.

The silicon-containing polymer may have a weight average molecular weight of about 1,000 to about 100,000.

The silicon-containing polymer may have a number average molecular weight of about 500 to about 10,000.

The solvent may include benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, p-menthane, dipropylether, dibutylether, anisole, butyl acetate, amyl acetate, methylisobutylketone, or a combination thereof.

The silicon-containing polymer may be included in an amount of about 0.1 wt % to about 30 wt %, based on a total weight of the composition for forming a silica layer.

The embodiments may be realized by providing a silica layer manufactured from the composition for following a silica layer according to an embodiment.

The embodiments may be realized by providing an electronic device including the silica layer according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
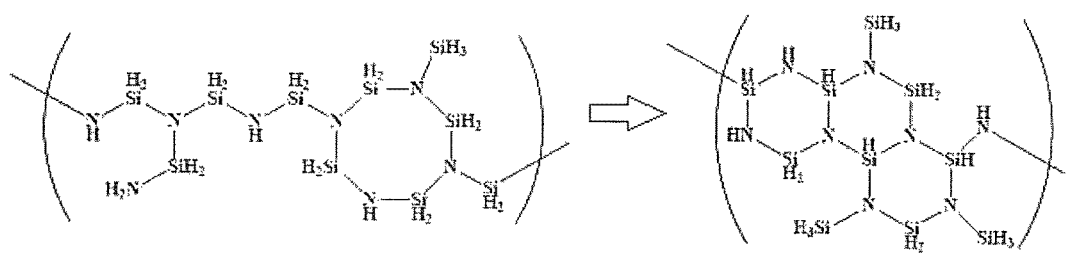
FIG. 1 illustrates a reference drawing of a cross-linking degree of a silicon-containing polymer by quantifying a peak area of SiH, SiH$_2$, SiH$_3$, and NH$_{1,2}$ at $^1$H-NMR spectrum of a silicon-containing polymer.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the thickness of layers, films, panels, regions, etc., may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, when a definition is not otherwise provided, "substituted" refers to replacement of a hydrogen of a compound by a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C30 heterocycloalkyl group, and a combination thereof. As used herein, when a definition is not otherwise provided, the term 'hetero' refers to one including 1 to 3 heteroatoms selected from N, O, S, and P.

In addition, in the specification, "*" refers to a linking point with the same or different atom or Chemical Formula.

Hereinafter, a silicon-containing polymer for a silica layer according to an embodiment is described.

According to an embodiment, a composition for forming a silica layer may include a silicon-containing polymer satisfying Equations 1 and 2 in a $^1$H-NMR spectrum and a solvent.

$$B/A = 0.2 \text{ to } 0.4 \quad \text{[Equation 1]}$$

$$(A+B)/C = 4.8 \text{ to } 12.0 \quad \text{[Equation 2]}$$

In Equations 1 and 2,

A is a peak area of greater than or equal to about 4.5 ppm and less than about 5.5 ppm, B is a peak area of greater than or equal to about 3.8 ppm and less than about 4.5 ppm, and C is a peak area of greater than or equal to about 0.2 ppm and less than 2.5 ppm:

provided that the $^1$H-NMR spectrum is measured according to Condition 1:

[Condition 1]

adding a silicon-containing polymer to a dibutyl ether (DBE) solvent to prepare a Sample 1 having a solid content of about 15±0.1 wt %, taking 3 cc of the Sample 1, dispensing the 3 cc of the Sample 1 in the center of a silicon wafer having a diameter of 8 inch using a spin coater, and spin-rotating it at 1,500 rpm for 5 minutes to form a film on the silicon wafer, taking or removing the film with a cutter and mixing the film with a CDCl$_3$ (chloroform-d) solvent to prepare a solution, preparing a Sample 2 in which a content of the film is 3.0 wt % based on a total amount of the solution, and measuring a $^1$H-NMR spectrum of the Sample 2 at 300 MHz.

In Equations 1 and 2, A refers to an area in the range where SiH and SiH$_2$ are exhibited; B refers to an area in the range where SiH$_3$ is exhibited; and C refers to an area in the range where NH$_{1,2}$ is exhibited. The $^1$H-NMR spectrum may be an important index defining a structural characteristic of the silicon-containing polymer.

FIG. 1 illustrates a reference drawing which helps to understand a structure for expressing the cross-linking degree of a silicon-containing polymer by quantifying a peak area of SiH, SiH$_2$, SiH$_3$, and NH$_{1,2}$ at $^1$H-NMR spectrum of the silicon-containing polymer.

Referring to FIG. 1, a polysilazane polymer may have a repeating unit that includes silicon and nitrogen, and the other parts except the binding parts with silicon and nitrogen for the repeating unit may form a bond with hydrogen. In this view point, a ratio of SiH$_{1,2,3}$/NH$_{1,2}$ may be a yardstick for confirming or a means for observing or determining a cross-linking degree of a polymer. As the cross-linking degree of the polymer increases, the ratio of SiH$_{1,2,3}$/NH$_{1,2}$ (analyzed through a $^1$H-NMR spectrum) may also increase. The results show that a layer denseness or density and a etch resistance in a gap may be improved when the polysilazane polymer is changed to a silica layer.

As the silicon-containing polymer simultaneously satisfies Equations 1 and 2 at $^1$H-NMR spectrum and has the structural characteristics, it may simultaneously provide excellent etch resistance, gap-fill characteristics, and planarization characteristics when forming a silica layer.

The etch resistance means having a low etch rate for etching gas or etching liquid, so the higher etch resistance may accomplish a rigid layer.

The excellent gap-fill characteristics may help enhance a denseness of an internal oxide layer by closely filling the silica layer formed from the silicon-containing polymer into a gap of an integrated circuit (IC).

A film flatness means a thickness uniformity of the silica layer formed from the silicon-containing polymer, so the subsequent process after forming the silica layer may be more facilitated as the film flatness is higher (e.g., flatter).

Generally, the characteristics are in a trade-off relationship to each other. But the silicon-containing polymer for a silica layer according to an embodiment may simultaneously satisfy the etch resistance, gap-fill characteristics, and planarization characteristics by controlling the structure to satisfy both Equations 1 and 2.

In an implementation, (A+B)/C in Equation 2 may be about 5.0 to about 10.5, e.g., about 5.2 to about 9.0.

In an implementation, the silicon-containing polymer may include polysilazane, polysiloxazane, or a combination thereof, and may have, e.g., a weight average molecular weight of about 1,000 to about 100,000. In an implementation, the silicon-containing polymer for forming the silica layer may have a number average molecular weight of, e.g., about 500 to about 10,000.

In an implementation, the silicon-containing polymer may include, e.g., a moiety represented by Chemical Formula A.

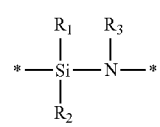

[Chemical Formula A]

In Chemical Formula A, R$_1$ to R$_3$ may each independently be or include, e.g., hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, a substituted or unsubstituted alkoxy group, a carboxyl group, an aldehyde group, a hydroxy group, or a combination thereof, and "*" indicates a linking point.

In an implementation, the silicon-containing polymer may be polysilazane produced by a reaction of halosilane with ammonia.

In an implementation, the silicon-containing polymer in the composition for forming a silica layer may further include a moiety represented by Chemical Formula B in addition to moiety represented by Chemical Formula A.

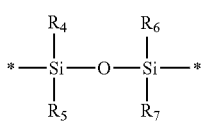

[Chemical Formula B]

$R_4$ to $R_7$ of Chemical Formula B may each independently be or include, e.g., hydrogen, a substituted or unsubstituted C1 to C30 alkyl group, a substituted or unsubstituted C3 to C30 cycloalkyl group, a substituted or unsubstituted C6 to C30 aryl group, a substituted or unsubstituted C7 to C30 arylalkyl group, a substituted or unsubstituted C1 to C30 heteroalkyl group, a substituted or unsubstituted C2 to C30 heterocycloalkyl group, a substituted or unsubstituted C2 to C30 alkenyl group, substituted or unsubstituted alkoxy group, a carboxyl group, an aldehyde group, a hydroxy group, or a combination thereof, and "*" indicates a linking point.

In this case, the silicon-containing polymer may include a silicon-oxygen-silicon (Si—O—Si) bond moiety in its structure in addition to a silicon-nitrogen (Si—N) bond moiety. The silicon-oxygen-silicon (Si—O—Si) bond moiety may help weaken or alleviate stress during curing by a heat treatment and may help reduce contraction.

In an implementation, the silicon-containing polymer includes the moiety represented by Chemical Formula A and the moiety represented by Chemical Formula B, and may further include a moiety represented by Chemical Formula C.

  [Chemical Formula C]

The moiety represented by Chemical Formula C has a structure where the terminal end is capped with hydrogen, and may be included in an amount of about 15 to about 35 wt %, based on the total amount of the Si—H bond of the polysilazane or polysiloxazane structure. When the moiety of Chemical Formula C is included in the polysilazane or polysiloxazane structure within the range, a $SiH_3$ moiety may be prevented from being scattered into $SiH_4$ while an oxidation reaction sufficiently occurs during the heat treatment, and a crack in a filler pattern may be prevented.

In an implementation, the silicon-containing polymer may be included in an amount of about 0.1 wt % to about 50 wt %, e.g., about 0.1 wt % to about 30 wt %, based on the total weight of the composition for forming a silica layer. When it is included within the ranges, it may maintain an appropriate viscosity and bring about flat and uniform layer with no gap (void).

The solvent of the composition for forming a silica layer may be a suitable solvent in which the silicon-containing polymer is soluble. In an implementation, the solvent may include, e.g., benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, p-menthane, dipropylether, dibutylether, anisole, butyl acetate, amyl acetate, methylisobutylketone, or a combination thereof.

In an implementation, the composition for forming a silica layer may further include a thermal acid generator (TAG).

The thermal acid generator may be an additive to improve developing a property of the composition for forming a silica layer, and thus makes the polymers of the composition be developed at a relatively low temperature.

The thermal acid generator may include a suitable compound that generates acid ($H^+$) by heat. For example, it may include a compound activated at 90° C. or higher and generating sufficient acid and also, having low volatility.

The thermal acid generator may include, e.g., nitrobenzyl tosylate, nitrobenzyl benzenesulfonate, phenol sulfonate, or a combination thereof.

The thermal acid generator may be included in an amount of about 0.01 to about 25 wt %, based on the total weight of the composition for forming a silica layer. Within the range, the polymer may be developed at a low temperature and simultaneously, have improved coating properties.

The composition for forming a silica layer may further include a surfactant.

The surfactant may include, e.g., a non-ionic surfactant such as polyoxyethylene alkyl ethers such as polyoxyethylene lauryl ether, polyoxyethylene stearyl ether, polyoxyethylene cetyl ether, polyoxyethylene oleyl ether, and the like, polyoxyethylene alkylallyl ethers such as polyoxyethylenenonyl phenol ether, and the like, polyoxyethylene·polyoxypropylene block copolymers, polyoxyethylene sorbitan fatty acid ester such as sorbitan monolaurate, sorbitan monopalmitate, sorbitan monostearate, sorbitan monoleate, polyoxyethylene sorbitan monostearate, polyoxyethylene sorbitan trioleate, polyoxyethylene sorbitan tristearate, and the like; a fluorine-based surfactant of EFTOP EF301, EF303, EF352 (Tochem Products Co., Ltd.), MEGAFACE F171, F173 (Dainippon Ink & Chem., Inc.), FLUORAD FC430, FC431 (Sumitomo 3M), Asahi guardAG710, Surflon S-382, SC101, SC102, SC103, SC104, SC105, SC106 (Asahi Glass Co., Ltd.), and the like; other silicone-based surfactant such as a organosiloxane polymer KP341 (Shin-Etsu Chemical Co., Ltd.), or the like.

The surfactant may be included in an amount of about 0.001 to about 10 wt %, based on the total weight of the composition for forming a silica layer. Within the range, dispersion of a solution and simultaneously, uniform thickness of a layer may be improved.

The composition for forming a silica layer may be a solution obtained by dissolving the silicon-containing polymer and the components in the solvent.

In an implementation, a method for manufacturing a silica layer may include coating the composition for forming a silica layer on the substrate; drying the substrate coated with the composition for forming a silica layer; and curing the resultant under an inert gas atmosphere of greater than or equal to about 150° C.

For example, the composition for forming a silica layer may be coated using a solution process such as a spin-on coating method, slit coating, inkjet printing.

In an implementation, the substrate may be, e.g., a device substrate such as a semiconductor, a liquid crystal, or the like.

In an implementation, a silica layer may include a silica component obtained by converting the silicon-containing polymer for a silica layer.

In an implementation, the silica layer may be, e.g., an insulation layer, a separation layer, or a hard coating layer.

The embodiments may provide an electronic device including the silica layer. The electronic device may be, e.g., a display device such as LCD or LED, or semiconductor device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparation of Composition for Forming Silica Layer

COMPARATIVE POLYMERIZATION EXAMPLE 1

Dry nitrogen was used to substitute or purge the inside of a 3 L reactor equipped with a stirrer and a temperature controller. 2,000 g of dry pyridine was put in the reactor and the mixture was kept at 0° C. Subsequently, 100 g of dichlorosilane was slowly added thereto over one hour. 85 g of ammonia was slowly injected thereto over 12 hours, while the obtained mixture was stirred. Then, dry nitrogen was injected into the reactor for 120 minutes, and the ammonia remaining in the reactor was removed.

The obtained white slurry-phase product was filtered with a 1 μm Teflon filter under a dry nitrogen atmosphere, obtaining 1,000 g of a filtered solution. Then, 1,000 g of dry xylene was added thereto, and the mixture was adjusted to have a solid concentration of 30 wt % by performing (a total of three times) a solvent exchange from the pyridine to xylene with a rotary evaporator and then, filtered with a Teflon filter having a pore size of 0.03 μm.

Through the procedures, polysilazane having a weight average molecular weight of 3,200 and (A+B)/C=4.29 was obtained.

In the present specification, the weight average molecular weight of polysilazane was measured by using GPC (PLC Pump 1515, RI Detector 2414) made by Waters and (A+B)/C was measured by NMR (300 MHz) made by Bruker.

COMPARATIVE POLYMERIZATION EXAMPLE 2

Dry nitrogen was used to purge the inside of a 3 L reactor equipped with a stirrer and a temperature controller. 2,000 g of dry pyridine was put in the reactor and the mixture was kept at 0° C. Subsequently, 100 g of dichlorosilane was slowly added thereto over one hour. 85 g of ammonia was slowly injected thereto over 3 hours, while the obtained mixture was stirred. Then, dry nitrogen was injected into the reactor for 120 minutes, and the ammonia remaining in the reactor was removed.

The obtained white slurry-phase product was filtered with a 1 μm Teflon filter under a dry nitrogen atmosphere, obtaining 1,000 g of a filtered solution. Then, 1,000 g of dry xylene was added thereto, and the mixture was adjusted to have a solid concentration of 30 wt % by performing (a total of three times) a solvent exchange from the pyridine to xylene with a rotary evaporator and then, filtered with a Teflon filter having a pore size of 0.03 μm.

Through the procedures, polysilazane having a weight average molecular weight of 1,800 and (A+B)/C=3.86 was obtained.

POLYMERIZATION EXAMPLE 1

Dry nitrogen was used to purge the inside of a 3 L reactor equipped with a stirrer and a temperature controller. 1,500 g of dry pyridine was put in the reactor and the mixture was kept at 0° C. Subsequently, 100 g of dichlorosilane was slowly added thereto over one hour. Then, 70 g of ammonia was slowly added thereto over 3 hours. Then, dry nitrogen was injected into the reactor for 120 minutes, and ammonia remaining in the reactor was removed.

The obtained white slurry-phase product was filtered with a 1 μm Teflon filter under a dry nitrogen atmosphere, obtaining 1,000 g of a filtered solution. Then, 1,000 g of dry xylene was added thereto, and the mixture was adjusted to have a solid concentration of 30 wt % by performing (a total of three times) a solvent exchange from the pyridine to xylene with a rotary evaporator and then, filtered with a Teflon filter having a pore size of 0.03 μm.

Through the procedures, polysilazane having a weight average molecular weight of 3,200, (A+B)/C=4.84 was obtained.

POLYMERIZATION EXAMPLE 2

Dry nitrogen was used to substitute the inside of a 3 L reactor equipped with a stirrer and a temperature controller. 1,500 g of dry pyridine was put in the reactor and the mixture was kept at 0° C. Subsequently, 100 g of dichlorosilane was slowly added thereto over one hour. Subsequently, 70 g of ammonia was slowly added thereto over 3 hours. Then, dry nitrogen was injected into the reactor for 120 minutes, and ammonia remaining in the reactor was removed.

The obtained white slurry-phase product was filtered with a 1 μm Teflon filter under a dry nitrogen atmosphere, obtaining 1,000 g of a filtered solution. Then, 1,000 g of dry xylene was added thereto, and the mixture was adjusted to have a solid concentration of 30 wt % by performing (a total of three times) a solvent exchange from the pyridine to xylene with a rotary evaporator and then, filtered with a Teflon filter having a pore size of 0.03 μm.

300 g of dry pyridine was put in the filtered solution and the resultant was heated to 100° C. until its weight average molecular weight was 5,400.

Through the procedures, polysilazane having a weight average molecular weight of 5,400 and (A+B)/C=5.46 was obtained.

POLYMERIZATION EXAMPLE 3

A polysilazane polymer having a weight average molecular weight of 11,200 and (A+B)/C=6.10 was obtained through the same procedures as Polymerization Example 2, except that the resultant was heated to 100° C. until its weight average molecular weight was 11,200.

POLYMERIZATION EXAMPLE 4

A polysilazane polymer having a weight average molecular weight of 22,400 and (A+B)/C=6.70 was obtained through the same procedures as Polymerization Example 2, except that the resultant was heated to 100° C. until its weight average molecular weight was 22,400.

Polymerization Example 5

A polysilazane polymer having a weight average molecular weight of 64,200 and (A+B)/C=7.22 was obtained through the same procedures as Polymerization Example 2, except that the resultant was heated to 100° C. until its weight average molecular weight was 64,200.

POLYMERIZATION EXample 6

A polysilazane polymer having a weight average molecular weight of 98,000 and (A+B)/C=8.52 was obtained through the same procedures as Polymerization Example 2, except that the resultant was heated to 100° C. until its weight average molecular weight was 98,000.

POLYMERIZATION EXAMPLE 7

Dry nitrogen was used to purge the inside of a 3 L reactor equipped with a stirrer and a temperature controller. 1,500 g of dry pyridine was put in the reactor and the mixture was kept at 10° C. Subsequently, 100 g of dichlorosilane was slowly added thereto over one hour. 50 g of ammonia was slowly injected thereto over 6 hours, while the obtained mixture was stirred. Then, dry nitrogen was injected into the reactor for 120 minutes, and ammonia remaining in the reactor was removed.

The obtained white slurry-phase product was filtered with a 1 μm Teflon filter under a dry nitrogen atmosphere, obtaining 1,000 g of a filtered solution. Then, 1,000 g of dry xylene was added thereto, and the mixture was adjusted to have a solid concentration of 30 wt % by performing (a total of three times) a solvent exchange from the pyridine to xylene with a rotary evaporator and then, filtered with a Teflon filter having a pore size of 0.03 μm.

300 g of dry pyridine was put in the filtered solution and the resultant was heated to 100° C. until its weight average molecular weight was 3,400.

Through the procedures, polysilazane having a weight average molecular weight of 3,400 and (A+B)/C=8.12 was obtained.

Measurement of Peak Area of SiH, $SiH_2$, $SiH_3$, and NH at $^1$H-NMR Spectrum

Each silicon-containing polymer obtained from Comparative Polymerization Examples 1 to 2 and Polymerization Examples 1 to 7 was added into a dibutyl ether (DBE) solvent to prepare a Sample 1 having a solid content of 15±0.1 wt %. Subsequently, 3 cc of Sample 1 was taken and dispensed in the center of a silicon wafer (LG Siltron) having a diameter of 8 inches using a spin coater (MS-A200, MIKASA Co., Ltd.) and spin-rotated at 1,500 rpm for 5 minutes to provide a membrane on the silicon wafer. The obtained membrane was removed with a cutter, and the film was mixed with a $CDCl_3$ (Chloroform-d) solvent to provide a solution. The amount of the film was adjusted to be 3.0 wt % based on a total amount of the solution to provide Sample 2. Subsequently, Sample 2 was measured for a $^1$H-NMR spectrum at 300 MHz.

A peak area ranging from greater than or equal to 4.5 ppm to less than 5.5 ppm at $^1$H-NMR spectrum was defined as a peak area (A) of SiH and $SiH_2$; a peak area ranging from greater than or equal to 3.8 ppm to less than 4.5 ppm was defined as a peak area (B) of $SiH_3$; a peak area from greater than or equal to 0.2 ppm to less than 2.5 ppm was defined as a peak area (C) of NH; so B/A and (A+B)/C were each calculated.

The results are shown in Table 1.

TABLE 1

|  | B/A | (A + B)/C | Weight average molecular weight |
|---|---|---|---|
| Comparative Polymerization Example 1 | 0.245 | 4.29 | 3,200 |
| Comparative Polymerization Example 2 | 0.223 | 3.86 | 1,800 |
| Polymerization Example 1 | 0.271 | 4.84 | 3,200 |
| Polymerization Example 2 | 0.273 | 5.46 | 5,400 |
| Polymerization Example 3 | 0.279 | 6.10 | 11,200 |
| Polymerization Example 4 | 0.288 | 6.70 | 22,400 |

TABLE 1-continued

|  | B/A | (A + B)/C | Weight average molecular weight |
|---|---|---|---|
| Polymerization Example 5 | 0.296 | 7.22 | 64,200 |
| Polymerization Example 6 | 0.310 | 8.52 | 98,000 |
| Polymerization Example 7 | 0.252 | 8.12 | 3,400 |

Referring to Table 1, it may be see that the silicon-containing polymers of Comparative Polymerization Examples 1, 2 and Polymerization Examples 1 to 7 satisfy the ranges set by the following Equations 1 and 2, when measuring for $^1$H-NMR spectrum.

$$B/A = 0.2 \text{ to } 0.4 \quad \text{[Equation 1]}$$

$$(+B)/C = 4.8 \text{ to } 12.0 \quad \text{[Equation 2]}$$

Preparation of Composition for Forming Silica Layer

COMPARATIVE EXAMPLES 1 and 2

Each solvent of polysilazane obtained from Comparative Polymerization Examples 1 and 2 was substituted with dibutyl ether using a rotary evaporator to provide each composition for forming a silica layer having a solid content of 15 wt %.

EXAMPLES 1 to 7

Each solvent of polysilazane obtained from Polymerization Examples 1 to 7 was substituted with dibutyl ether using a rotary evaporator to provide each composition for forming a silica layer having a solid content of 15 wt %.

Evaluation 1: Film Flatness 3 cc of the compositions for a silica layer according to Comparative Examples 1 and 2 and Examples 1 to 7 were respectively taken and then dispensed with a spin coater in the center of a silicon wafer having a diameter of 8 inch and spin-coated at 1,500 rpm for 20 seconds (MS-A200, MIKASA Co., Ltd.). Subsequently, the coated wafers were heated at 150° C. for 3 minutes on a hot plate and dried to form a silica-based layer.

Figure 2:
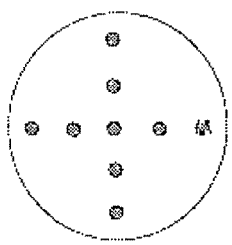
FIG. 2 illustrates a reference drawing for a method of evaluating a thickness uniformity of each layer obtained by using compositions according to Examples 1 to 7 and Comparative Examples 1 and 2.

Then, average thickness, thickness range (a minimum thickness—a maximum thickness), and thickness uniformity of the silica-based layers were obtained by measuring thickness of the silica-based layers at 9 points on the wafer with a shape of a cross (+) by using a reflection spectroscopic film thickness meter (ST-5000, K-MAC) as shown in FIG. 2, and film flatness of the silica-based layers were obtained by the following Equation.

Film flatness=[(maximum thickness−minimum thickness)/2/average thickness]*100

The results are shown in Table 2.

TABLE 2

|  | Average thickness (Å) | Thickness Range (Å) | Film flatness |
|---|---|---|---|
| Comparative Example 1 | 4,554 | 167 | 1.8 |
| Comparative Example 2 | 3,961 | 177 | 2.2 |
| Example 1 | 4,949 | 101 | 1.0 |
| Example 2 | 5,952 | 104 | 0.9 |
| Example 3 | 5,964 | 87 | 0.7 |
| Example 4 | 5,951 | 75 | 0.6 |
| Example 5 | 5,932 | 77 | 0.6 |
| Example 6 | 5,988 | 62 | 0.5 |
| Example 7 | 5,912 | 75 | 0.6 |

Referring to Table 2, it may be seen that Examples 1 to 7 had relatively lower film flatness (e.g., were flatter) than Comparative Examples 1 and 2. This shows that the silica-based layers obtained from the compositions containing a polysilazane polymer having B/A and (A+B)/C satisfying the described ranges had a relatively uniform thickness, as in Examples 1 to 7.

Evaluation 2: Gap-Fill Characteristics

Each composition for forming a silica based layer according to Comparative

Examples 1 and 2 and Examples 1 to 7 was coated on a patterned silicon wafer and baked to provide a thin film. Subsequently, the cross-section thereof was attached to a mount and performed with a platinum sputtering (Pt sputtering) at 6 mA for 8 seconds using a HR coater. The pre-treated sample was observed in a magnification of 100,000 using an electron microscope (S5500, Hitachi).

Figure 3:
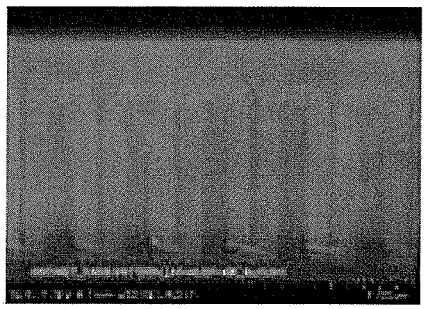
FIG. 3 illustrates an electron microscopic image of a silica layer obtained from Example 2.
Figure 4:
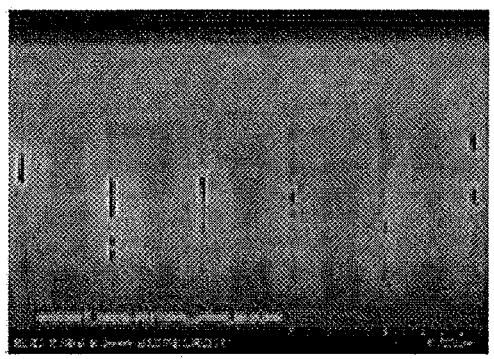
FIG. 4 illustrates an electron microscopic image of a silica layer obtained from Comparative Example 2.

The results are shown in Table 3 and FIGS. 3 and 4.

TABLE 3

|  | Gap-fill characteristic |
|---|---|
| Comparative Example 1 | Inferior |
| Comparative Example 2 | Inferior |
| Example 1 | Good |
| Example 2 | Good |
| Example 3 | Good |
| Example 4 | Good |
| Example 5 | Good |
| Example 6 | Good |
| Example 7 | Good |

As shown in Table 3, it is understood that the compositions for forming a silica based layer according to Examples 1 to 7 showed the gap-fill characteristic results of "good", on the other hand, the compositions for forming a silica based layer according to Comparative Examples 1 and 2 showed the gap-fill characteristic results of "inferior".

This shows that the layer formed from the composition containing a polysilazane polymer having B/A and (A+B)/C satisfying the described range had excellent gap-fill characteristics.

In addition, as shown in FIGS. 3 and 4, it may be seen that the gap-fill of the silica layer obtained from Example 2 was better formed than in the silica layer obtained from Comparative Example 2.

Evaluation 3: Evaluation of Etch Resistance (Denseness) of Silica Layer

Each composition for forming a silica based layer according to Comparative

Examples 1 and 2 and Examples 1 to 7 was spin-coated on a pattern wafer having a size of 3 cm×3 cm (manufactured by MIKASA, MS-A200). Then it was soft-baked at 150° C. for 3 minutes. Subsequently, a high temperature oxidation reaction was performed to convert the same to an oxide layer at 800° C. and then dipped in an aqueous solution (DHF 100:1) in which hydrofluoric acid and ammonium fluoride were mixed for 5 minutes. Then the pattern was etched into a size of each 40 nm, 100 nm and 200 nm, and the etching amount of the inside of the formed gap (i.e., inside of pattern) was calculated according to a trigonometry (manufactured by Hitachi: S-5500).

A polysilazane solution was spin-coated on a bare wafer in accordance with the same method and soft baked at 150° C. for 3 minutes. Subsequently, a high temperature oxidation reaction was performed to convert the same to an oxide layer at 800° C., and the thickness thereof was measured. Then it was dipped in an aqueous solution (DHF 100:1) in which hydrofluoric acid and ammonium fluoride were mixed for 5 minutes, and then the thickness of the etched surface was measured by a reflection spectroscopic film thickness meter (ST-5000) manufactured by K-MAC, and the external surface etching amount thereof was calculated, so as to find a denseness of an internal oxide layer.

The denseness of an internal oxide layer was obtained as the following Equation:

Denseness of an internal oxide layer=external surface etching amount/etching amount inside a pattern The results are shown in Table 4.

TABLE 4

| | Denseness of internal oxide layer | | |
|---|---|---|---|
| | pattern size 40 nm | pattern size 100 nm | pattern size 200 nm |
| Comparative Example 1 | 0.35 | 0.35 | 0.33 |
| Comparative Example 2 | 0.32 | 0.31 | 0.32 |
| Example 1 | 0.49 | 0.47 | 0.48 |
| Example 2 | 0.49 | 0.47 | 0.48 |
| Example 3 | 0.51 | 0.51 | 0.50 |
| Example 4 | 0.52 | 0.52 | 0.51 |
| Example 5 | 0.54 | 0.53 | 0.52 |
| Example 6 | 0.54 | 0.54 | 0.53 |
| Example 7 | 0.53 | 0.54 | 0.52 |

As shown in Table 4, it may be seen that the cases of using compositions according to Examples 1 to 7 had excellent denseness of the inside of the gap in all patterns having each size of less than or equal to 200 nm, compared to the cases of using compositions according to Comparative Examples 1 and 2.

By way of summation and review, an insulation layer may be a silica layer formed by converting a silicon-containing polymer into silica. Herein, etch resistance, gap-fill characteristics, planarization characteristics, and the like of a silica layer may be different according to a structure of a silicon-containing polymer, and storage stability of a composition for forming a silica layer may be affected. These characteristics may have trade-off relationship with each other. A silica layer may desirably satisfy the properties simultaneously.

The embodiments may provide a composition for forming a silica layer having improved etch resistance, gap-fill characteristics, and planarization characteristics.

The silicon-containing polymer for forming a silica layer according to an embodiment has excellent etch resistance, gap-fill characteristics, and planarization characteristics. By providing a composition including the same, the obtained silica layer may accomplish excellent etch resistance and planarization characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for forming a silica layer, the composition comprising:
a silicon-containing polymer; and
a solvent,
wherein a $^1$H-NMR spectrum of the silicon-containing polymer satisfies Equations 1 and 2:

$$B/A = 0.2 \text{ to } 0.4 \quad \text{[Equation 1]}$$

$$(A+B)/C = 4.8 \text{ to } 12.0 \quad \text{[Equation 2]}$$

wherein, in Equations 1 and 2,
A is a peak area of greater than or equal to about 4.5 ppm and less than about 5.5 ppm,
B is a peak area of greater than or equal to about 3.8 ppm and less than about 4.5 ppm, and
C is a peak area of greater than or equal to about 0.2 ppm and less than 2.5 ppm:
the $^1$H-NMR spectrum being measured according to Condition 1:
[Condition 1]
adding the silicon-containing polymer to a dibutylether (DBE) solvent to prepare a Sample 1 having a solid content of about 15±0.1 wt %,
taking 3 cc of the Sample 1, dispensing the Sample 1 in the center of a silicon wafer having a diameter of 8 inch using a spin coater, and spin-rotating it at 1,500 rpm for 5 minutes to form a film on the silicon wafer,
taking the film with a cutter and mixing the taken film with a CDCl$_3$ (chloroform-d) solvent to prepare a solution,
preparing a Sample 2 where a content of the taken film is 3.0 wt % based on a total amount of the solution, and
measuring a $^1$H-NMR spectrum of the Sample 2 at 300 MHz, and
wherein the silicon-containing polymer has a number average molecular weight of about 500 to about 10,000, and
wherein the silicon-containing polymer is included in an amount of greater than 0.1 wt % to less than or equal to 50 wt %, based on a total weight of the composition for forming a silica layer.

2. The composition for forming a silica layer as claimed in claim 1, wherein in Equation 2, (A+B)/C ranges from about 5.0 to about 10.5.

3. The composition for forming a silica layer as claimed in claim 2, wherein in Equation 2, (A+B)/C ranges from about 5.2 to about 9.0.

4. The composition for forming a silica layer as claimed in claim 1, wherein the silicon-containing polymer includes a polysilazane, a polysiloxazane, or a combination thereof.

5. The composition for forming a silica layer as claimed in claim 1, wherein the silicon-containing polymer has a weight average molecular weight of about 1,000 to about 100,000.

6. The composition for forming a silica layer as claimed in claim 1, wherein the solvent includes benzene, toluene, xylene, ethylbenzene, diethylbenzene, trimethylbenzene, triethylbenzene, cyclohexane, cyclohexene, decahydro naphthalene, dipentene, pentane, hexane, heptane, octane, nonane, decane, ethylcyclohexane, methylcyclohexane, p-menthane, dipropylether, dibutylether, anisole, butyl acetate, amyl acetate, methylisobutylketone, or a combination thereof.

7. The composition for forming a silica layer as claimed in claim 1, wherein the silicon-containing polymer is included in an amount of about 0.1 wt % to about 30 wt %, based on a total weight of the composition for forming a silica layer.

8. A silica layer manufactured from the composition for forming a silica layer as claimed in claim 1.

9. An electronic device comprising the silica layer as claimed in claim 8.

10. The composition for forming a silica layer as claimed in claim 1, wherein in Equation 2, (A+B)/C ranges from 4.8 to about 9.0.

11. The composition for forming a silica layer as claimed in claim 1, wherein the silicon-containing polymer has a weight average molecular weight of about 1,000 to about 11,200.

* * * * *